(12) United States Patent
Chen et al.

(10) Patent No.: US 12,390,008 B2
(45) Date of Patent: Aug. 19, 2025

(54) SLIDE RAIL MECHANISM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 258 days.

(21) Appl. No.: 18/220,289

(22) Filed: Jul. 11, 2023

(65) Prior Publication Data

US 2024/0280138 A1    Aug. 22, 2024

(30) Foreign Application Priority Data

Feb. 21, 2023   (TW) ................................. 112106567

(51) Int. Cl.
*A47B 88/45*        (2017.01)
*A47B 88/443*       (2017.01)

(52) U.S. Cl.
CPC ................................ *A47B 88/443* (2017.01)

(58) Field of Classification Search
CPC ..... A47B 88/45; A47B 88/443; A47B 88/447; A47B 2210/007; H05K 7/1489
See application file for complete search history.

(56) References Cited

U.S. PATENT DOCUMENTS

| 4,988,214 | A | * | 1/1991 | Clement | A47B 88/493 |
| | | | | | 312/333 |
| 7,357,468 | B2 | | 4/2008 | Hwang | |
| 10,729,241 | B2 | * | 8/2020 | Chen | H05K 7/1489 |
| 11,064,807 | B2 | | 7/2021 | Chen | |
| 2011/0176755 | A1 | | 7/2011 | Chen | |
| 2016/0278522 | A1 | | 9/2016 | Chen | |
| 2019/0200757 | A1 | * | 7/2019 | Chen | A47B 88/443 |

FOREIGN PATENT DOCUMENTS

| EP | 3 307 038 A1 | 4/2018 |
| JP | 2018-187344 A | 11/2018 |
| JP | 2019-81083 A | 5/2019 |
| JP | 2020-11032 A | 1/2020 |
| JP | 2021-30057 A | 3/2021 |
| JP | 2021-79077 A | 5/2021 |

* cited by examiner

*Primary Examiner* — James O Hansen
(74) *Attorney, Agent, or Firm* — Winston Hsu

(57) ABSTRACT

A slide rail mechanism is provided and includes a supporting frame and a slide rail assembly. The supporting frame includes a disengaging feature. The slide rail assembly is movable with respect to the supporting frame. The slide rail assembly includes a first rail and a second rail. The second rail and the first rail displace synchronously during a displacement of the second rail with respect to the supporting frame away from a first predetermined position along a first predetermined direction. The disengaging feature of the supporting frame is configured to terminate a displacement synchronization between the second rail and the first rail when the second rail and the first rail are synchronously displaced to a second predetermined position along the first predetermined direction.

16 Claims, 14 Drawing Sheets

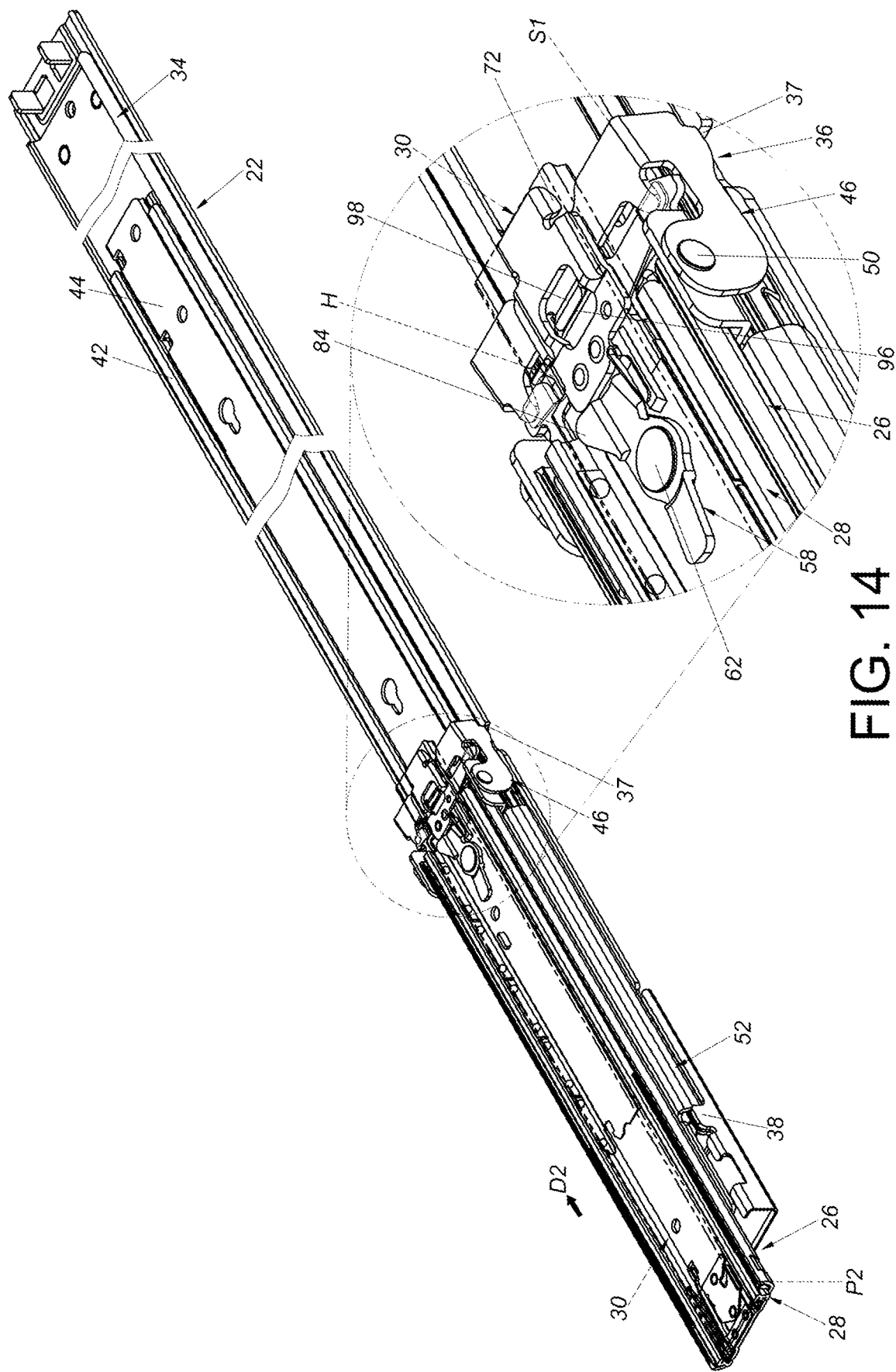

SLIDE RAIL MECHANISM

BACKGROUND OF THE INVENTION

1. Field of the Invention

The present invention relates to a slide rail product, and more specifically, to a slide rail mechanism having rails with synchronous displacing function.

2. Description of the Prior Art

U.S. Pat. No. 7,357,468 B2 discloses a slide rail assembly including three rails, i.e., an inner rail, a middle rail and an outer rail. The middle rail and the inner rail can displace synchronously to extend with respect to the outer rail. After the middle rail is positioned with respect to the outer rail, the inner rail and the middle rail can be disengaged from each other for allowing the inner rail to be independently displaced to a fully extended position. Furthermore, the inner rail and the middle rail can be sequentially retracted into the outer rail during a retracting operation of the slide rail assembly.

From the above, the conventional slide rail assembly only enables the inner rail and the middle rail to be synchronously extended. However, to meet different requirements, it becomes an important topic to provide an improved slide rail product.

SUMMARY OF THE INVENTION

The present invention provides a slide rail mechanism having rails with synchronous displacing function.

According an aspect of the present invention, a slide rail mechanism includes a supporting frame and a slide rail assembly. The supporting frame includes a disengaging feature. The slide rail assembly is movable with respect to the supporting frame. The slide rail assembly includes a first rail, a second rail and a third rail. The first rail is an outer rail. The second rail is a middle rail, and the third rail is an inner rail. The second rail and the first rail displace synchronously during a displacement of the second rail with respect to the supporting frame away from a first predetermined position along a first predetermined direction. The disengaging feature of the supporting frame is configured to terminate a displacement synchronization between the second rail and the first rail when the second rail and the first rail are synchronously displaced to a second predetermined position along the first predetermined direction.

According another aspect of the present invention, a slide rail mechanism includes a supporting frame and a slide rail assembly. The supporting frame includes a disengaging feature. The slide rail assembly is movable with respect to the supporting frame. The slide rail assembly includes a first rail, a second rail and a third rail. A disengaging structure is arranged on the first rail. The second rail and the first rail displace synchronously during a displacement of the second rail with respect to the supporting frame away from a first predetermined position along a first predetermined direction. The disengaging feature of the supporting frame is configured to terminate a displacement synchronization between the second rail and the first rail when the second rail and the first rail are synchronously displaced to a second predetermined position along the first predetermined direction. The third rail and the second rail displace synchronously during a displacement of the third rail along the first predetermined direction, and the disengaging structure is configured to terminate a displacement synchronization between the third rail and the second rail when the third rail and the second rail are synchronously displaced to a disengaging position along the first predetermined direction.

BRIEF DESCRIPTION OF THE DRAWINGS

FIG. 14 is a diagram of the slide rail assembly as the first rail is displaceable away from the second predetermined by the second rail displacing along the second predetermined direction according to the embodiment of the present invention.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure (s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
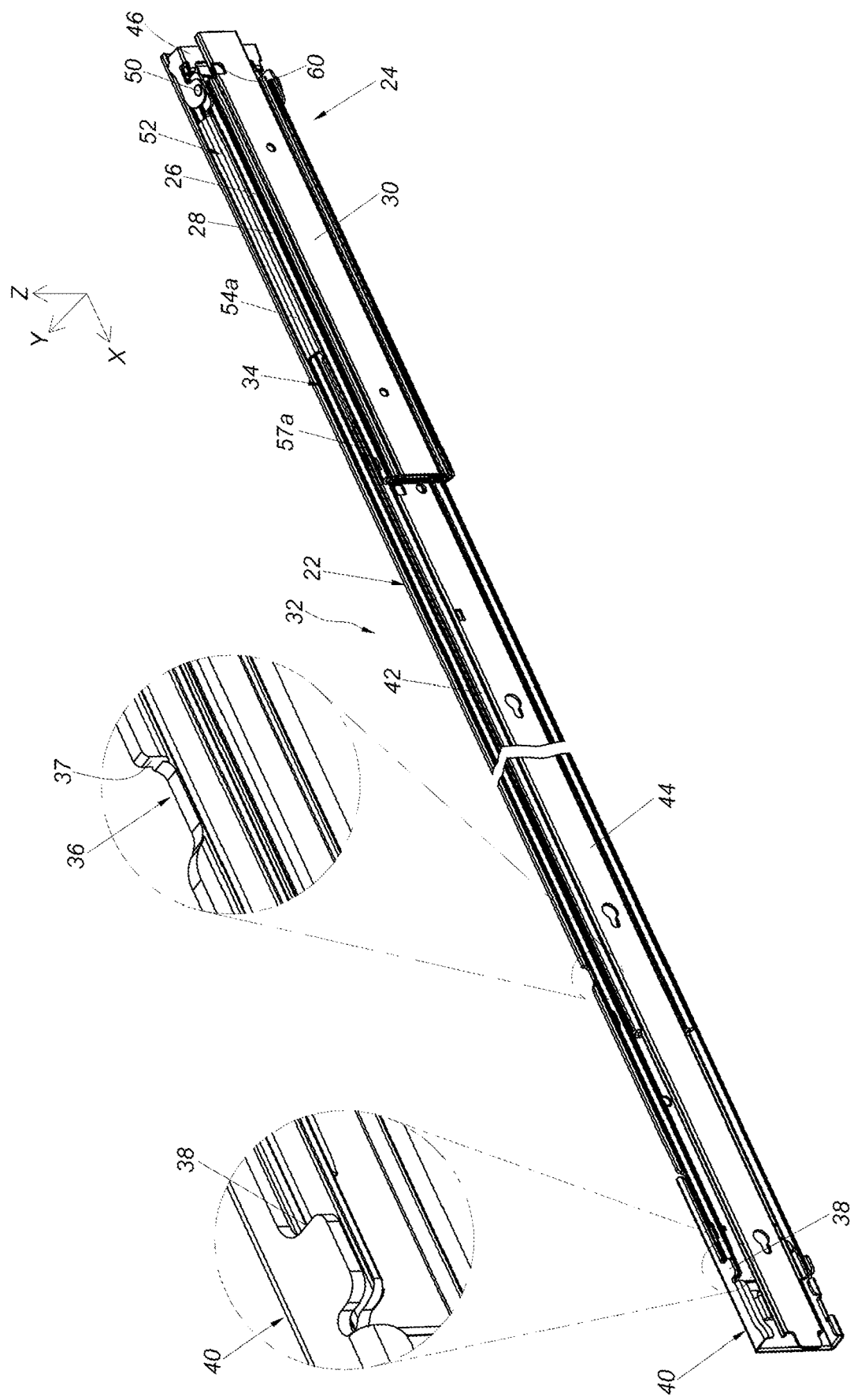
FIG. 1 is a perspective diagram of a slide rail mechanism according to an embodiment of the present invention.
Figure 2:
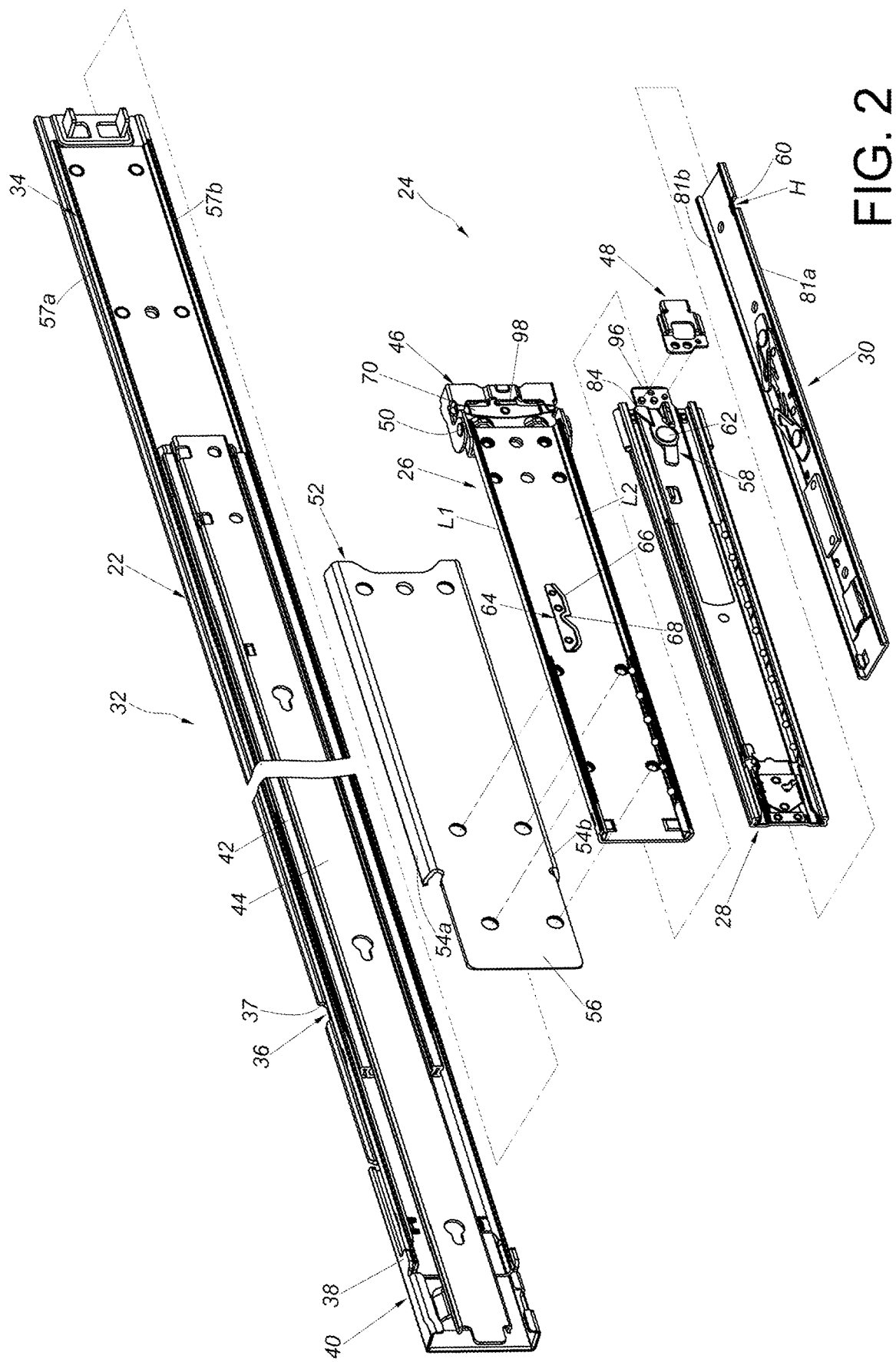
FIG. 2 is an exploded diagram of the slide rail mechanism according to the embodiment of the present invention.

As shown in FIG. 1 and FIG. 2, a slide rail mechanism includes a supporting frame 22 and a slide rail assembly 24. The slide rail assembly 24 is longitudinally movable with respect to the supporting frame 22. In this embodiment, by way of example, a longitudinal direction, i.e., a length direction or a displacing direction of a rail of the slide rail assembly 24, can be parallel to an X axis. A transverse direction, i.e., a lateral direction of the rail of the slide rail assembly 24, can be parallel to a Y axis. A vertical direction, i.e., a height direction of the rail of the slide rail assembly 24, can be parallel to a Z axis.

The slide rail assembly 24 includes a first rail 26, a second rail 28 and a third rail 30. The first rail 26 is an outer rail. The second rail 28 is a middle rail. The third rail 30 is an inner rail. In this embodiment, by way of example, the second rail 28 can be movably mounted between the first rail 26 and the third rail 30.

Preferably, the slide rail mechanism further includes a slide rail device 32. The slide rail device 32 includes the supporting frame 22 and a supporting rail 34 connected to the supporting frame 22. In this embodiment, by way of example, the supporting rail 34 can be fixedly connected to the supporting frame 22, such that the supporting rail 34 and the supporting frame 22 can be defined as an integral structure i.e., the supporting rail 34 can be considered as a part of the supporting frame 22.

The supporting frame 22 includes a disengaging feature 36 configured to terminate a displacement synchronization between the first rail 26 and the second rail 28. In this embodiment, by way of example, the disengaging feature 36 can be a notch formed by excavating. However, the present invention is not limited to this embodiment.

Preferably, the supporting frame 22 further includes a blocking feature 37 adjacent to the disengaging feature 36 and configured to block the first rail 26. In this embodiment, by way of example, the blocking feature 37 can be a blocking wall. However, the present invention is not limited to this embodiment.

Preferably, a blocking portion 38 is arranged on the supporting rail 34 and configured to block the first rail 26. In this embodiment, by way of example, the supporting rail 34 can include a bracket 40 located adjacent to an end portion, e.g., a front end portion, of the supporting rail 34, and the blocking portion 38 is arranged on the bracket 40.

The disengaging feature 36 can terminate the displacement synchronization between the first rail 26 and the second rail 28. The blocking feature 37 and the blocking portion 38 can prevent displacements of the first rail 26 along two different directions when the displacement synchronization between the first rail 26 and the second rail 28 is terminated. The disengaging feature 36, the blocking feature 37 and the blocking portion 38 do not cooperate with one another. Understandably, in another embodiment, at least one of the blocking feature and the blocking portion can be omitted.

Preferably, the supporting rail 34 includes a plurality of rails and a supporting channel for at least partially accommodating the plurality of rails. In this embodiment, by way of example, the supporting rail 34 can include a first movable rail 42 and a second movable rail 44. The first movable rail 42 and the second movable rail 44 can be at least partially accommodated inside the supporting channel, and the first movable rail 42 can be located between the supporting rail 34 and the second movable rail 44.

Preferably, the slide rail assembly 24 further includes a first auxiliary member 46 and a second auxiliary member 48. The first auxiliary member 46 is arranged on the first rail 26. The second auxiliary member 48 is arranged on the second rail 28.

Preferably, one of the first auxiliary member 46 and the second auxiliary member 48 is movable, and the other one of the first auxiliary member 46 and the second auxiliary member 48 is immovable. In this embodiment, by way of example, the first auxiliary member 46 can be pivotally connected to the first rail 26 by a shaft 50, and the second auxiliary member 48 is fixedly connected to the second rail 28.

Preferably, the slide rail assembly 24 further includes an auxiliary rail 52 arranged on the first rail 26. The first rail 26 is movably mounted the supporting rail 34 or the supporting frame 22 by the auxiliary rail 52. Furthermore, the auxiliary rail 52 includes a first auxiliary wall 54a, a second auxiliary wall 54b and a middle wall 56 connected to and located between the first auxiliary wall 54a and the second auxiliary wall 54b. The middle wall 56 is connected, e.g., fixedly connected, to a first side L1 of the first rail 26. The first auxiliary wall 54a and the second auxiliary wall 54b are configured to hold the supporting rail 34 or the supporting frame 22. In this embodiment, by way of example, the first auxiliary wall 54a and the second auxiliary wall 54b can hold a first wall 57a and a second wall 57b of the supporting rail 34. However, the present invention is not limited to this embodiment. Besides, the second rail 28 is at least partially movably mounted inside a first channel on a second side L2 of the first rail 26 opposite to the first side L1 of the first rail 26, and the third rail 30 is at least partially movably mounted inside a second channel on the second rail 28.

The supporting rail 34 and the auxiliary rail 52 are members for achieving the first rail 26 to be mounted on the supporting frame 22 indirectly and do not involve with terminating the displacement synchronization between the first rail 26 and the second rail 28 and/or preventing the displacement of the first rail 26 when the displacement synchronization between the first rail 26 and the second rail 28 is terminated. Understandably, in another embodiment, at least one of the supporting rail and the auxiliary rail can be omitted, e.g., the first rail can be movably mounted on the supporting frame directly or by the auxiliary rail indirectly, or the first rail can be movably mounted on the supporting rail directly.

Preferably, the slide rail assembly 24 further includes a working member 58 movably mounted on the second rail 28. A corresponding feature 60 is arranged on the third rail 30 and configured to cooperate with the working member 58.

Preferably, the working member 58 is pivotally connected to the second rail 28 by a connecting member 62.

Preferably, a retaining member 64 is arranged on the first rail 26. The retaining member 64 includes a disengaging structure 66 and a blocking structure 68 located adjacent to the disengaging structure 66. The disengaging structure 66 is configured to terminate a displacement synchronization between the third rail 30 and the second rail 28. The blocking structure 68 is configured to block the second rail 28 for preventing a displacement of the second rail 28. The disengaging structure 66 and the blocking structure 68 do not cooperate with each other. Understandably, in another embodiment, at least one of the disengaging structure and the blocking structure can be omitted. Furthermore, in this embodiment, by way of example, the disengaging structure 66 can be an inclined surface or an arc surface, and the blocking structure 68 can be an erecting wall. However, the present invention is not limited to this embodiment. Besides, understandably, in another embodiment, the disengaging structure and/or the blocking structure can be integrally formed with the first rail.

Figure 3:
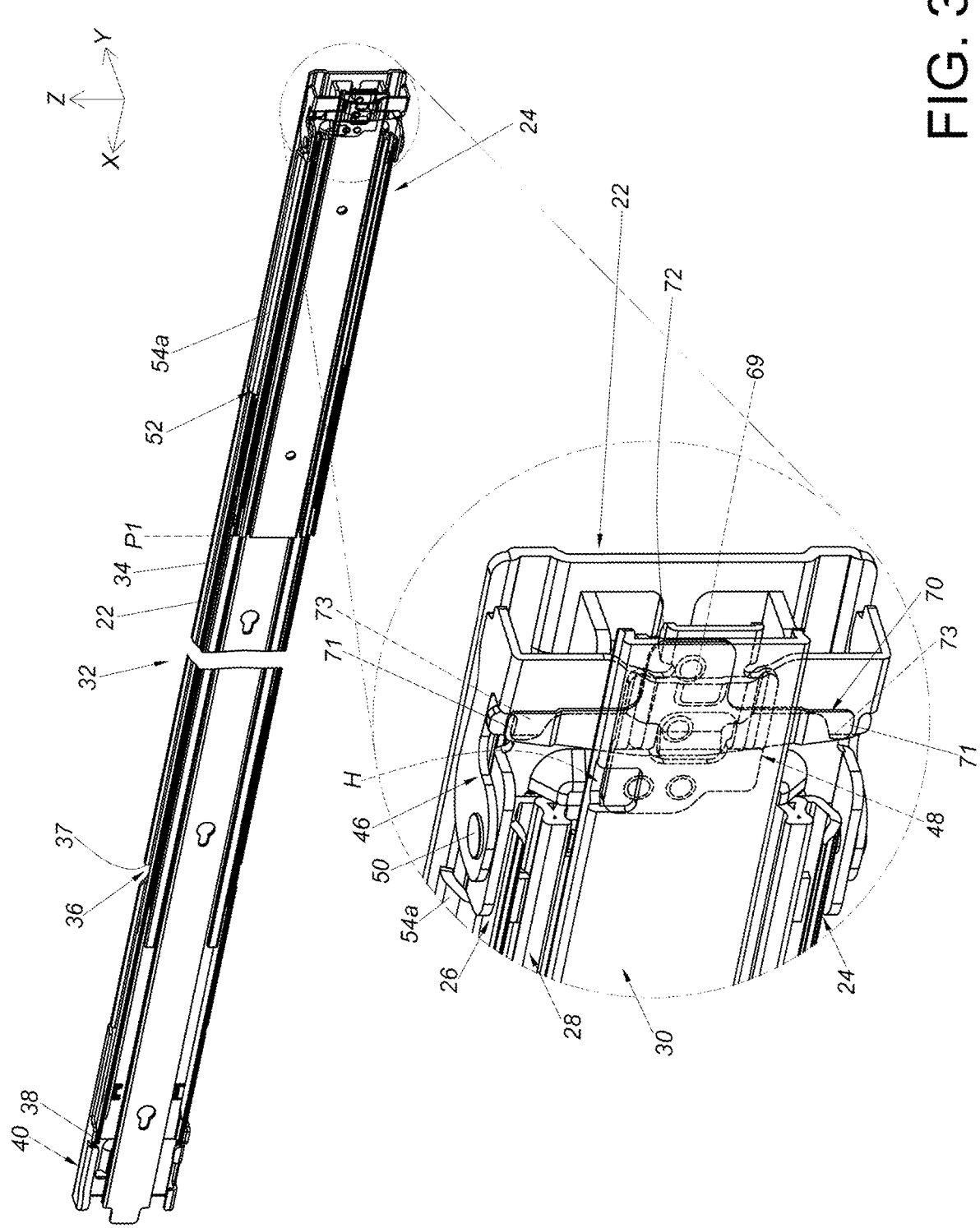
FIG. 3 is diagram of the slide rail mechanism as a slide rail assembly is in a retracted state according to the embodiment of the present invention.

As shown in FIG. 3, the slide rail assembly 24 is in a retracted state with respect to the supporting frame 22 or the slide rail device 32. The second rail 28 and the first rail 26 can displace synchronously during a displacement, e.g., a longitudinal displacement, of the second rail 28 with respect to the supporting frame 22 away from a first predetermined position P1, e.g., a retracted position as shown in FIG. 3, along a first predetermined direction D1, e.g., an opening direction. Furthermore, since the third rail 30 is at least partially mounted inside the second channel on the second rail 28, the third rail 30 is displaced together with the second rail 28 and the first rail 30 along the first predetermined direction D1 when the second rail 28 and the first rail 26 are displaced synchronously. Besides, the first rail 26 is frictionally displaceable with respect to the supporting rail 34 or the supporting frame 22 by the first auxiliary wall 54a and the second auxiliary wall 54b of the auxiliary rail 52 holding the supporting rail 34.

Figure 4:
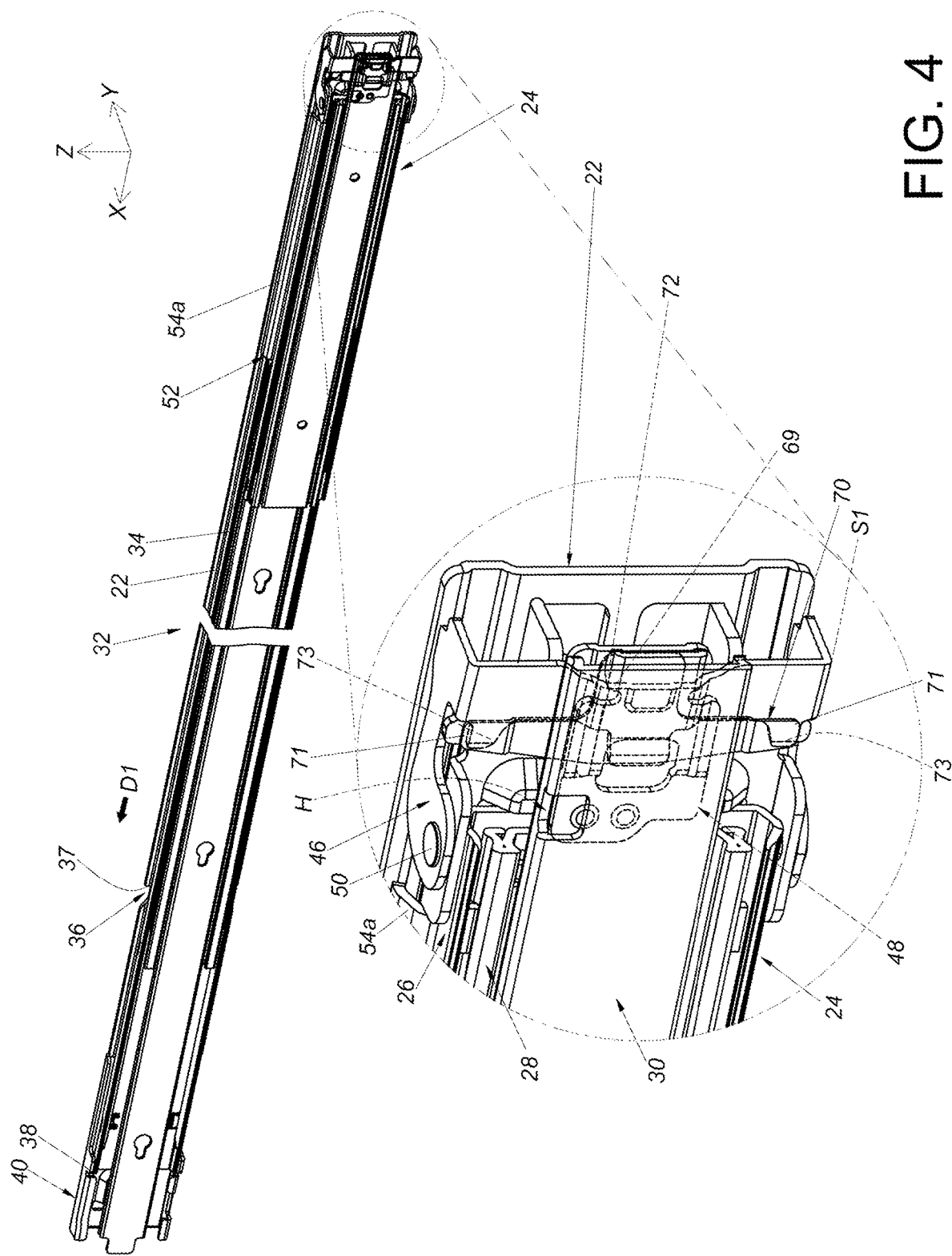
FIG. 4 is a diagram of the slide rail assembly as a second rail and a first rail are synchronously displaceable along a first predetermined direction according to the embodiment of the present invention.

Preferably, as shown in FIG. 4, during the displacement of the second rail 28 with respect to the supporting frame 22 away from the first predetermined position P1 along the first predetermined direction D1, the first auxiliary member 46 and the second auxiliary member 48 abut against each other, such that the second rail 28 drives the first rail 26 to synchronously displace together with the second rail 28 by an abutment of the first auxiliary member 46 and the second auxiliary member 48.

Preferably, the first auxiliary member 46 is configured to be retained in a first state S1 for abutting against the second auxiliary member 48 in response to a resilient deformation of a resilient member 70 and/or a support of the supporting frame 22. In this embodiment, by way of example, the second auxiliary member 48 can include at least one abutting portion 72, e.g., a hook portion or a hook-shaped structure as shown in FIG. 3, and the first auxiliary member 46 can include a corresponding portion 69, as shown in FIG. 4, configured to abut against the at least one abutting portion 72 for enabling synchronous displacements of the second rail 28 and the first rail 26 along the first predetermined direction D1.

Preferably, the resilient member 70 includes at least one resilient portion 71 configured to resiliently press at least one extending portion 73 of the first auxiliary member 46 along the transverse direction, e.g., the Y axis, and the first auxiliary member 46 is supported by the supporting frame 22, such that the first auxiliary member 46 is retained in the first state S1 as shown in FIG. 4.

Figure 5:
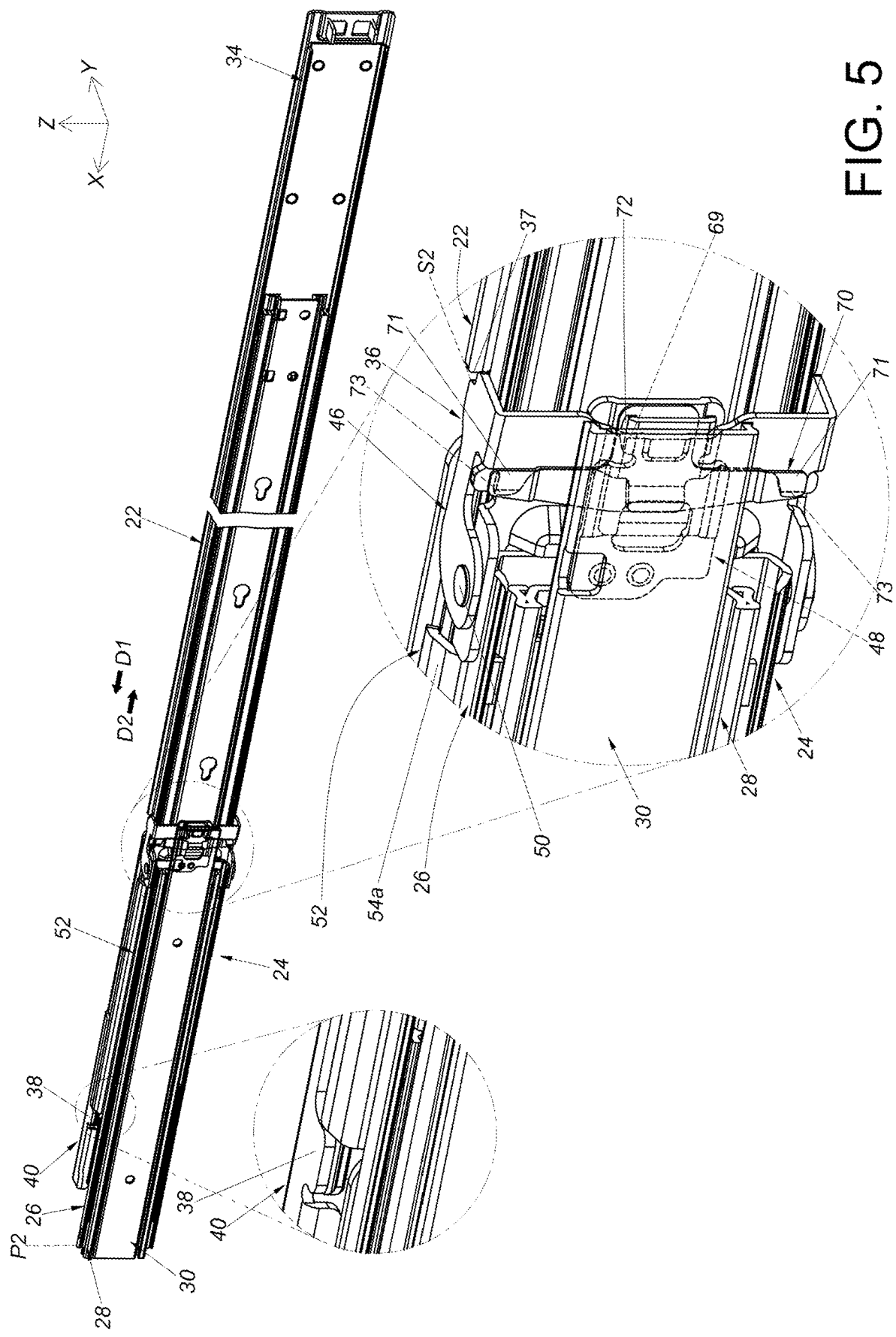
FIG. 5 is a diagram of the slide rail assembly as a displacement synchronization between the second rail and the first rail is terminated according to the embodiment of the present invention.

As shown in FIG. 5, the disengaging feature 36 of the supporting frame 22 is configured to terminate the displacement synchronization between the second rail 28 and the first rail 26 when the second rail 28 and the first rail 26 are synchronously displaced to a second predetermined position P2 along the first predetermined direction D1.

Preferably, the disengaging feature 36 is configured to providing a moving space for the first auxiliary member 46 for allowing the resilient member 70 to be released to drive the first auxiliary member 46 to move from the first state S1 to a second state S2 for disengaging the first auxiliary member 46, e.g., the corresponding portion 69 of the first auxiliary member 46, from the second auxiliary member 48, e.g., the abutting portion 72 of the second auxiliary member 48, to terminate the displacement synchronization between the second rail 28 and the first rail 26 when the second rail 28 and the first rail 26 are located at the second predetermined position P2. In this embodiment, by way of example, the corresponding portion 69 of the first auxiliary member 46 can be moved to be misaligned with the abutting portion 72 of the second auxiliary member 48 along the longitudinal direction, e.g., the X axis, so as to terminate the displacement synchronization between the second rail 28 and the first rail 26.

Preferably, when the first auxiliary member 46 is in the second state S2, the blocking feature 37 of the supporting frame 22 can block the first auxiliary member 46 to block the first rail 26 for preventing the first rail 26 from displacing away from the second predetermined position P2 along a second predetermined direction D2, e.g., a retracting direction, opposite to the first predetermined direction D1. Besides, the blocking portion 38 on the bracket 40 of the supporting rail 34 can block the first auxiliary member 46 or the auxiliary rail 52 to block the first rail 26 for preventing the first rail 26 from displacing away from the second predetermined position P2 along the first predetermined direction D1.

Figure 6:
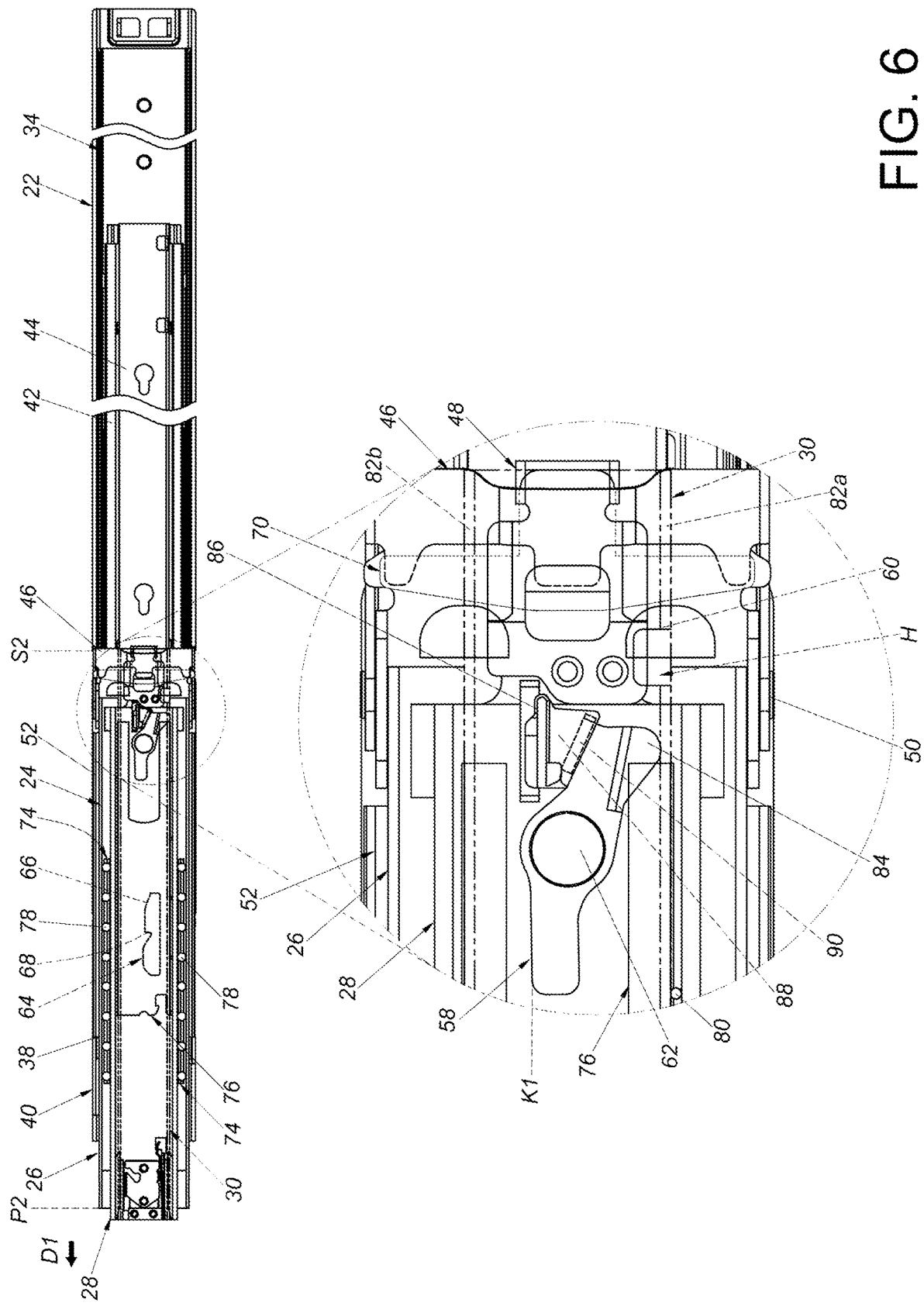
FIG. 6 is a diagram of the slide rail assembly as a third rail and the second rail are not synchronously displaceable with respect to the first rail along the first predetermined direction according to the embodiment of the present invention.
Figure 7:
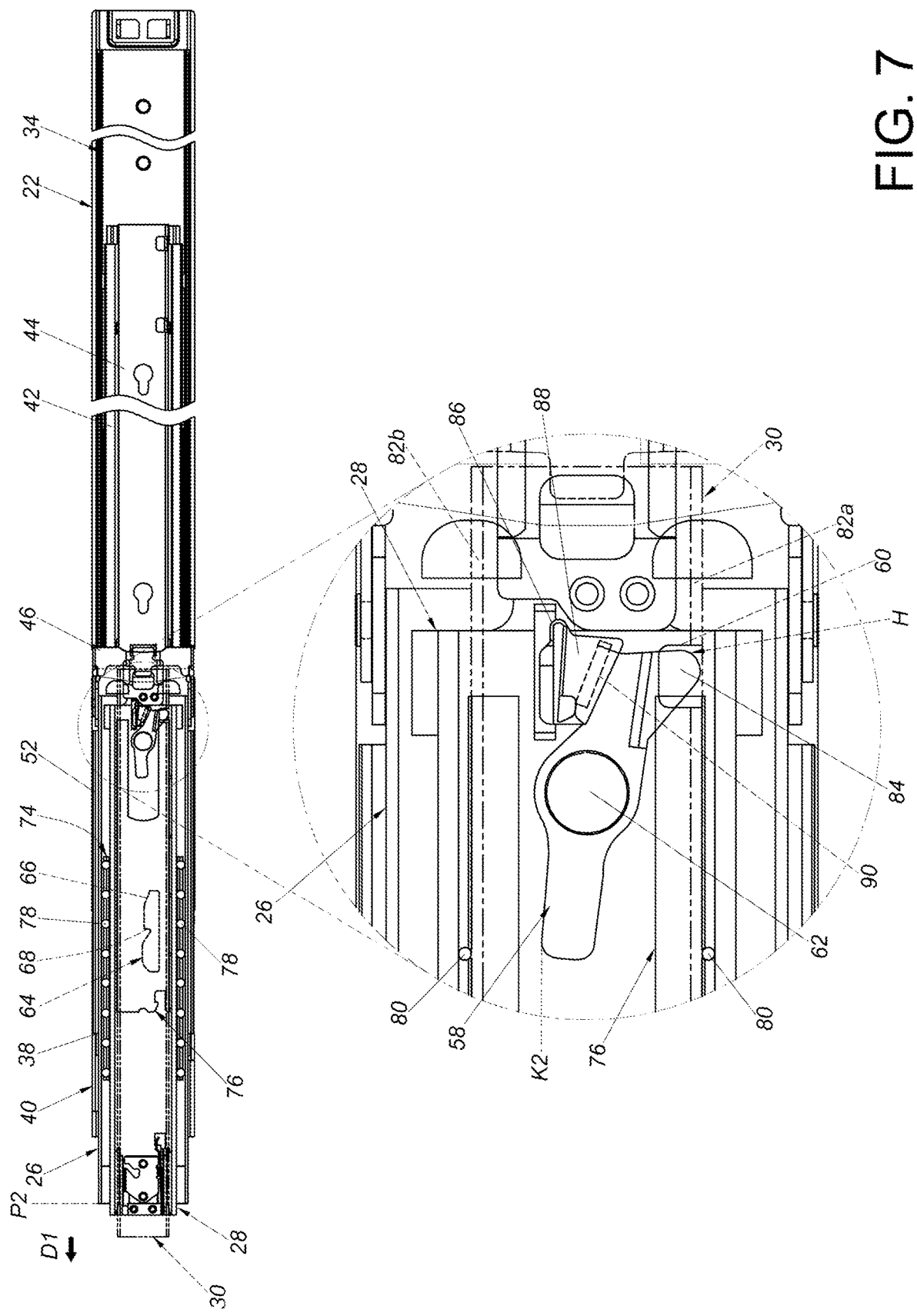
FIG. 7 is a diagram of the slide rail assembly as the third rail and the second rail are synchronously displaceable with respect to the first rail along the first predetermined direction according to the embodiment of the present invention.

As shown in FIG. 6 and FIG. 7, the slide rail assembly 24 further includes at least one first slide-aiding device 74 and a second slide-aiding device 76. The at least one first slide-aiding device 74 is movably mounted between the second rail 28 and the first rail 26 for facilitating a smooth displacement of the second rail 28 with respect to the first rail 26. The second slide-aiding device 76 is movably mounted between the second rail 28 and the third rail 30 for facilitating a smooth displacement of the third rail 30 with respect to the second rail 28. In this embodiment, by way of example, the first slide-aiding device 74 can include a plurality of first slide-aiding members 78, and the second slide-aiding device 76 can include a plurality of second slide-aiding members 80, wherein the first slide-aiding member 78 or the second slide-aiding member 80 can be a ball, a roller, or the like.

The corresponding feature 60 on the third rail 30 is spaced apart from the working member 58 on the second rail 28 by a predetermined longitudinal distance when the slide rail assembly 24 is in a state as shown in FIG. 6. The third rail 30 and the second rail 28 can be displaced along the first predetermined direction D1 when the first rail 26 is located at the second predetermined position P2. Preferably, the third rail 30 and the second rail 28 can displace synchronously during a displacement of the third rail 30 along the first predetermined direction D1. In this embodiment, by way of example, as shown in FIG. 7, during the displacement of the third rail 30 along the first predetermined direction D1, the corresponding feature 60 and the working member 58 abut against each other, such that the third rail 30 drives the second rail 28 to synchronously displace together with the third rail 30 by an abutment of the corresponding feature 60 and the working member 58.

Preferably, the third rail 30 includes a first wall 82a and a second wall 82b, and the corresponding feature 60 is arranged on the first wall 82a. In this embodiment, by way of example, the corresponding feature 60 can be a wall of a hole structure H. The first wall 82a of the third rail 30 can support the working member 58 for locating the working member 58 in an initial state K1 as shown in FIG. 6. During the displacement of the third rail 30 along the first predetermined direction D1, the hole structure H on the third rail 30 can be moved to a position corresponding to a synchronization feature 84 of the working member 58, such that the working member 58 can be driven to move, e.g., pivot, from the initial state K1 to a predetermined state K2 as shown in FIG. 7 by a resilient object 86, so as to enable the corresponding feature 60 on the third 30 and the synchronization feature 84 to abut against each other for allowing synchronous displacements of the third rail 30 and the second rail 28 along the first predetermined direction D1.

Preferably, as shown in FIG. 7, the second rail 28 includes a through hole 88, and a working portion 90 of the working member 58 extends toward the first rail 26 through the through hole 88. The working portion 90 of the working member 58 can cooperate with the retaining member 64, e.g., the disengaging structure 66 and the blocking structure 68 of the retaining member 64, on the first rail 26.

Figure 8:
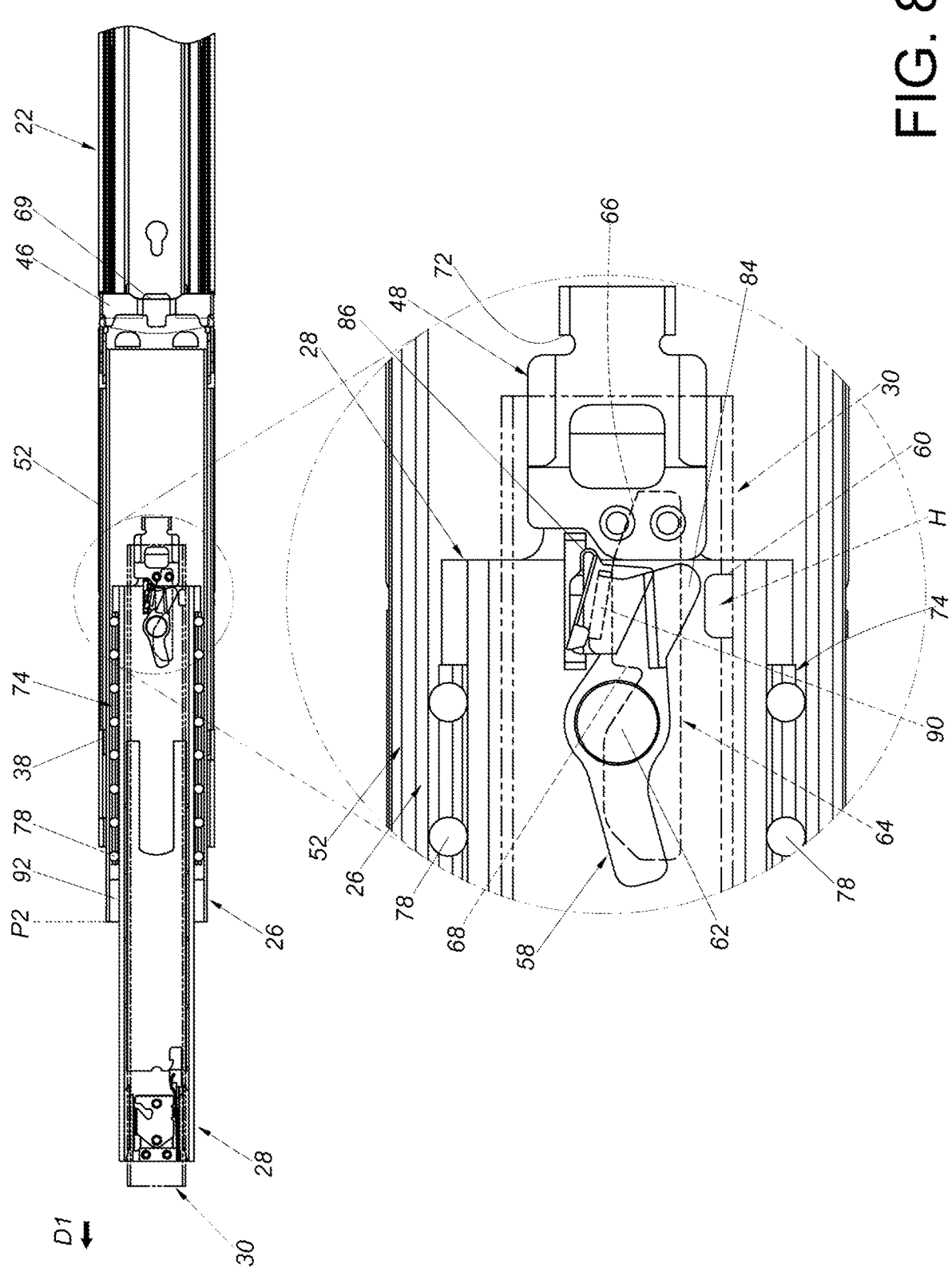
FIG. 8 is a diagram of the slide rail assembly as a displacement synchronization between the third rail and the second rail is terminated according to the embodiment of the present invention.

When the third rail 30 drives the second rail 28 to synchronously displace together with the third rail 30 from a position as shown in FIG. 7 to a disengaging position as shown in FIG. 8, the disengaging structure 66 on the first rail 26 is configured to terminate the displacement synchronization between the third rail 30 and the second rail 28. In this embodiment, by way of example, the working portion 90 of the working member 58 on the second rail 28 can be guided by the disengaging structure 66 on the first rail 26 to drive the working member 58 to move away from the predetermined state K2, e.g., by pivoting at a predetermined angle, such that the corresponding feature 60 on the third rail 30 does not abut against the synchronization feature 84 of the working member 58 for terminating the synchronization displacement between the third rail 30 and the second rail 28. When the synchronization displacement between the third rail 30 and the second rail 28 is terminated, the third rail 30 and the second rail 28 can be individually displaced with respect to the first rail 26 along the first predetermined direction D1. Besides, when the working member 58 is in a state as shown in FIG. 8, the resilient object 86 is resiliently deformed.

Figure 9:
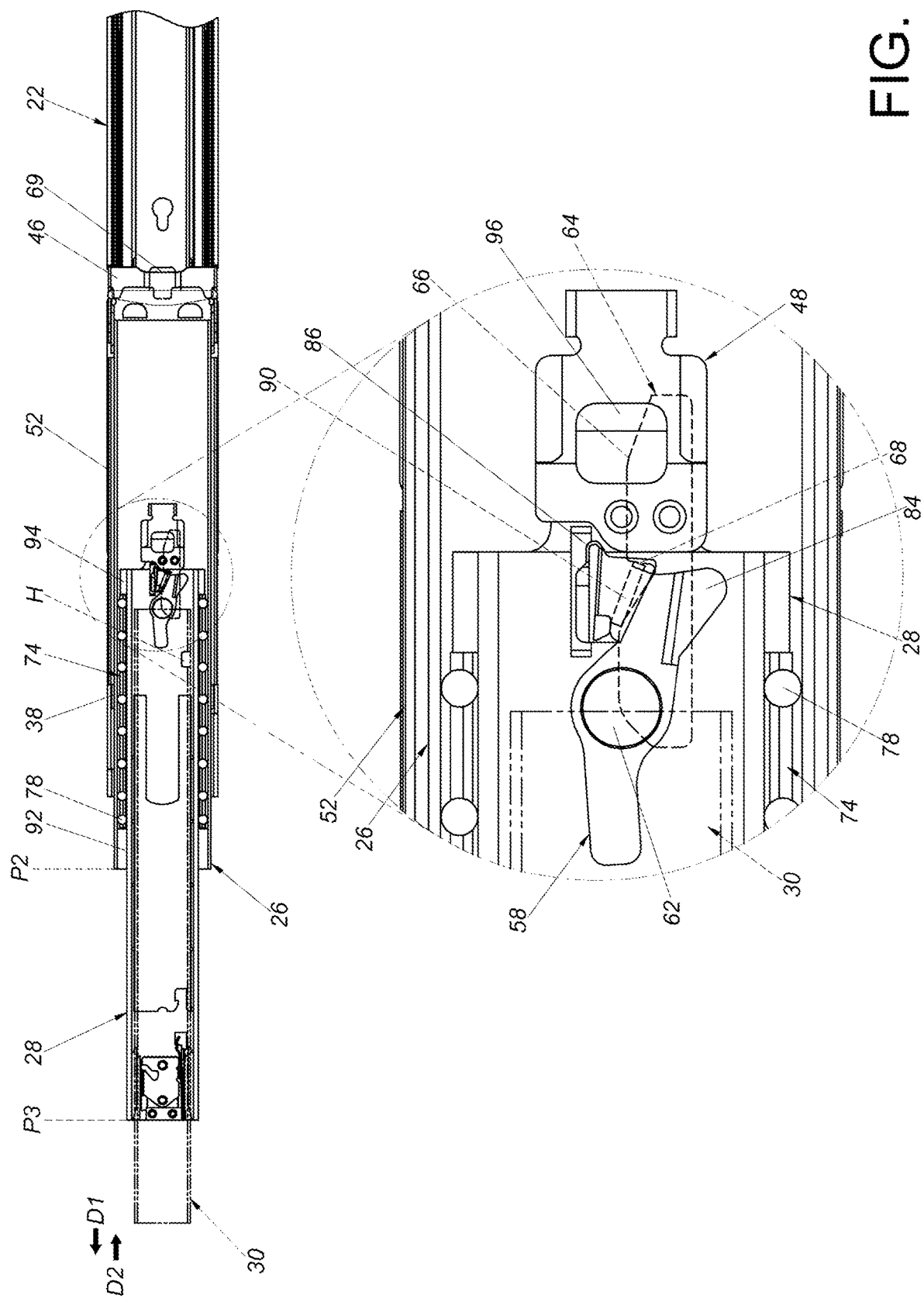
FIG. 9 is a diagram of the slide rail assembly as the second rail is displaced with respect to the first rail to a third predetermined position along the first predetermined direction according to the embodiment of the present invention.

As shown in FIG. 9, when the second rail 28 is further displaced to a third predetermined position P3 along the first predetermined direction D1, the blocking structure 68 on the first rail 26 is configured to block the second rail 28 for preventing the second rail 28 from displacing away from the third predetermined position P3 along the second predetermined direction D2. In this embodiment, by way of example, when the second rail 28 is located at the third predetermined position P3, the resilient object 86 is released to drive the working member 58 to move to a position as shown in FIG. 9, such that the working portion 90 of the working member 58 can be blocked by the blocking structure 68 on the first rail 26 for preventing the second rail 28 from displacing away from the third predetermined position P3 along the second predetermined direction D2.

Preferably, a first restraining feature 92 is further arranged on the first rail 26, and a second restraining feature 94 is further arranged on the second rail 28. When the second rail 28 is located at the third predetermined position P3, a front end and a rear end of the first slide-aiding device 74 abut against the first restraining feature 92 and the second restraining feature 94 respectively for preventing the second rail 28 from displacing away from the third predetermined position P3 along the first predetermined direction D1.

Figure 10:
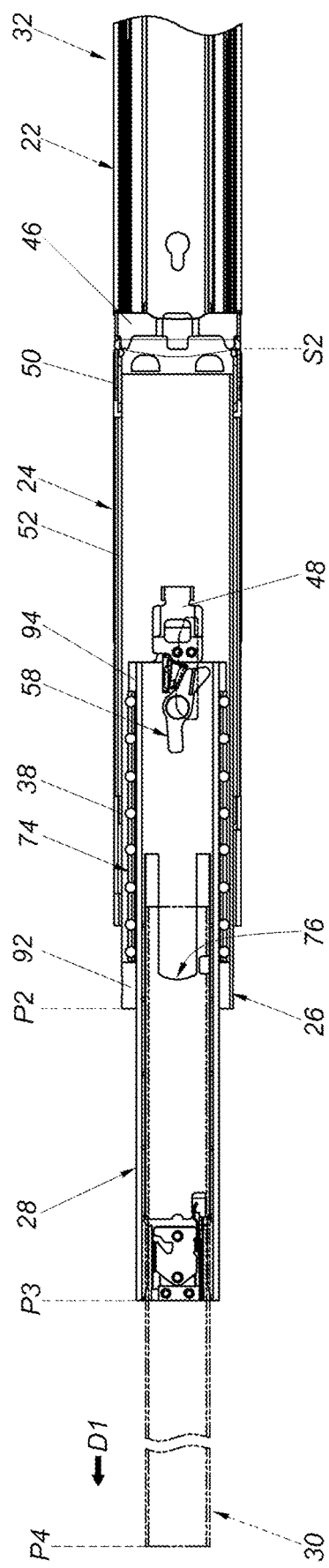
FIG. 10 is a diagram of the slide rail assembly in an extended state according to the embodiment of the present invention.

As shown in FIG. 9 and FIG. 10, when the second rail 28 is located at the third predetermined position P3, the third rail 30 can be further displaced to a fourth predetermined position P4 along the first predetermined direction D1, so as to locate the slide rail assembly 24 in an extended state, e.g., a fully extended state, with respect to the supporting frame 22 or the slide rail device 32. Preferably, when the third rail 30 is located at the fourth predetermined position P4, the second slide-aiding device 76 is located adjacent to an end portion, e.g., a front end portion, of the second rail 28.

Figure 11:
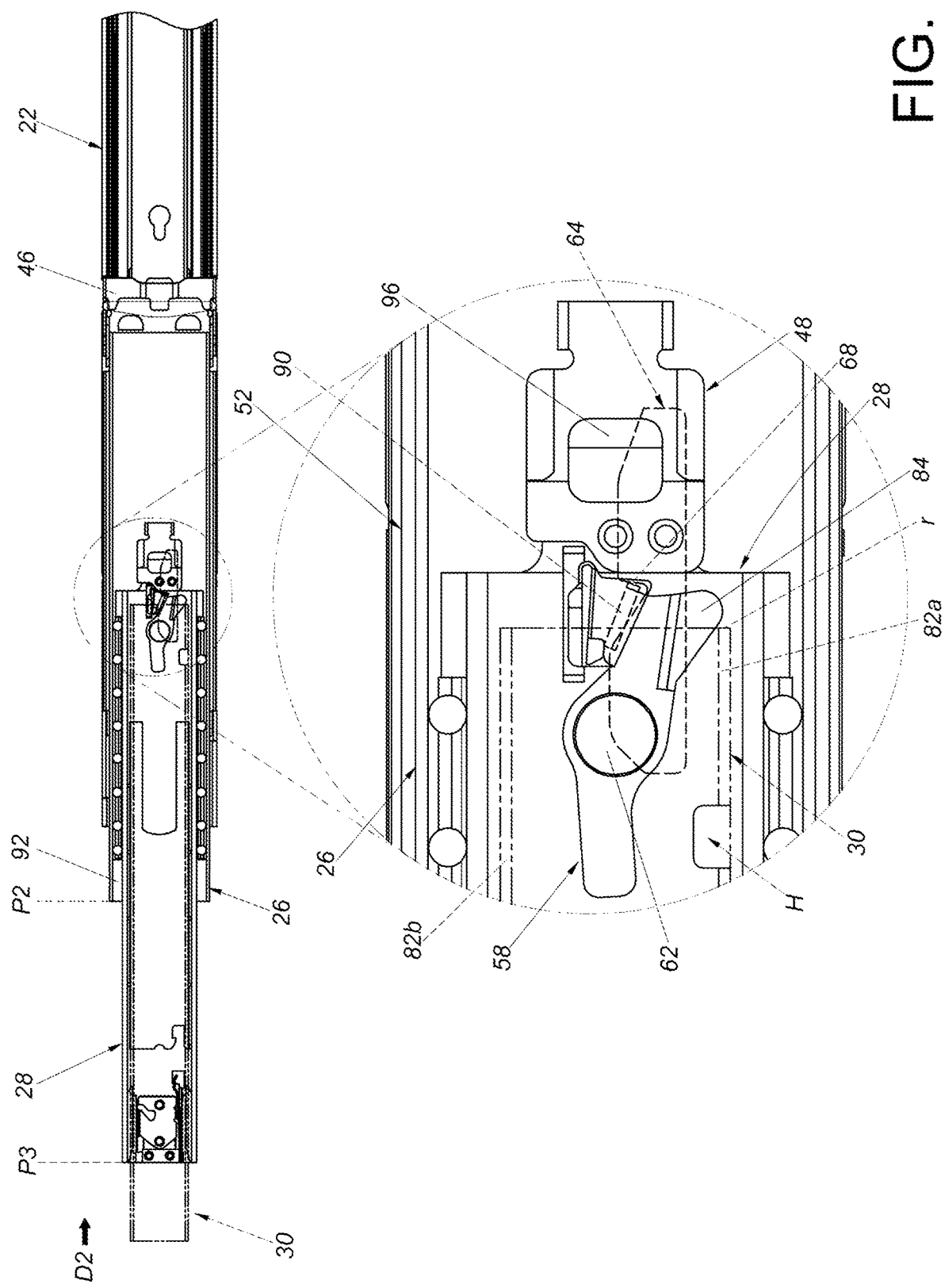
FIG. 11 is a diagram of the slide rail assembly as the third rail is displaced with respect to the second rail away from a fourth predetermined position along a second predetermined direction according to the embodiment of the present invention.
Figure 12:
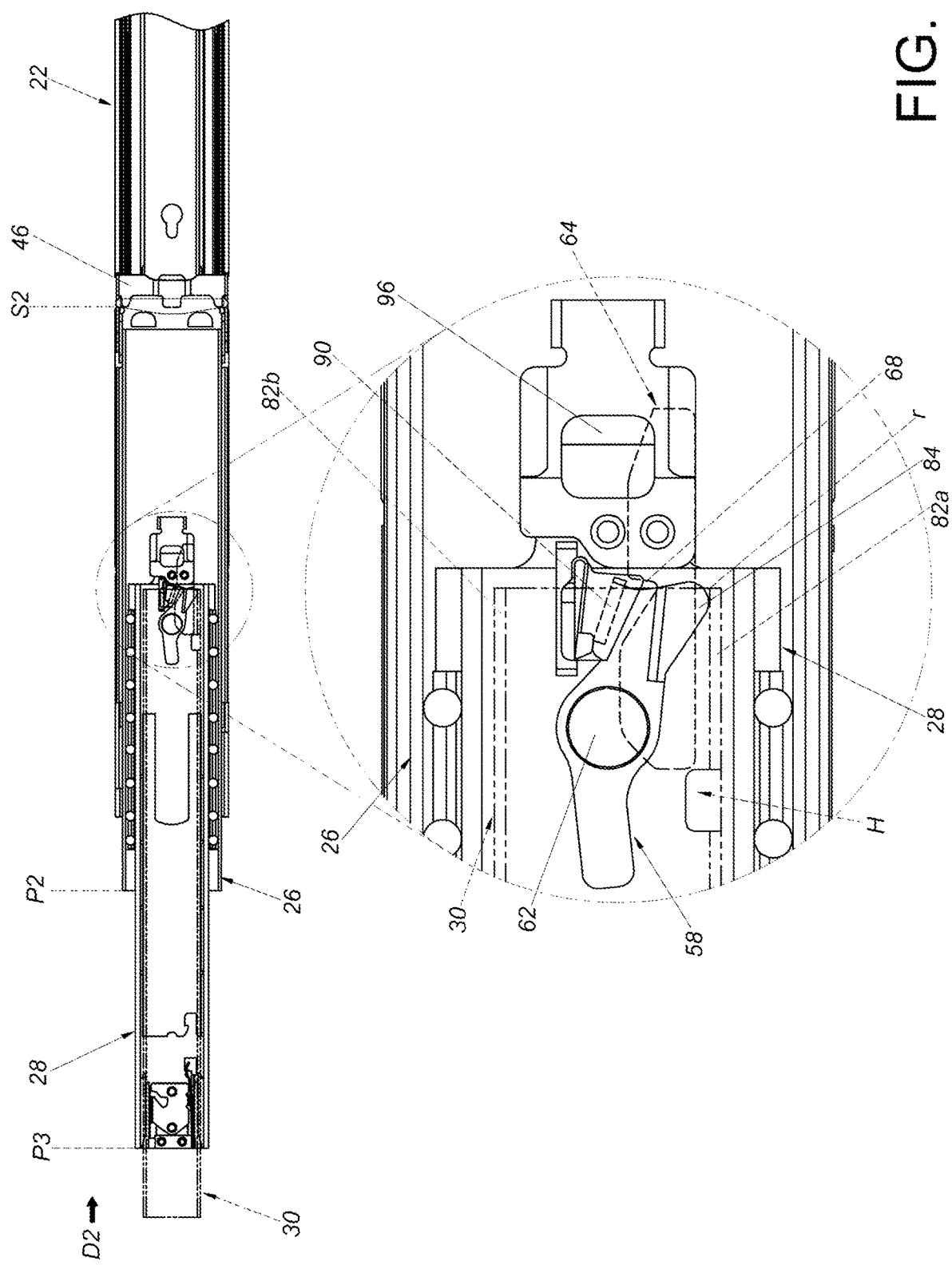
FIG. 12 is a diagram of the slide rail assembly as the second rail is displaceable away from the third predetermined position by the third rail displacing with respect to the second rail along the second predetermined direction according to the embodiment of the present invention.

As shown in FIG. 11 and FIG. 12, during a displacement of the third rail 30 away from the fourth predetermined position P4 along the second predetermined direction D2, the third rail 30 is configured to terminate a blocking between the blocking structure 68 and the second rail 28. Furthermore, a portion, e.g., a rear end portion r, of the third rail 30, is configured to abut against the synchronization feature 84 of the working member 58 for driving the working member 58 to prevent the working portion 90 of the working member 58 from being blocked by the blocking structure 68 on the first rail 26. When the working portion 90 of the working member 58 is not blocked by the blocking structure 68 on the first rail 26, the second rail 28 is allowed to displace away from the third predetermined position P3 along the second predetermined direction D2.

Figure 13:
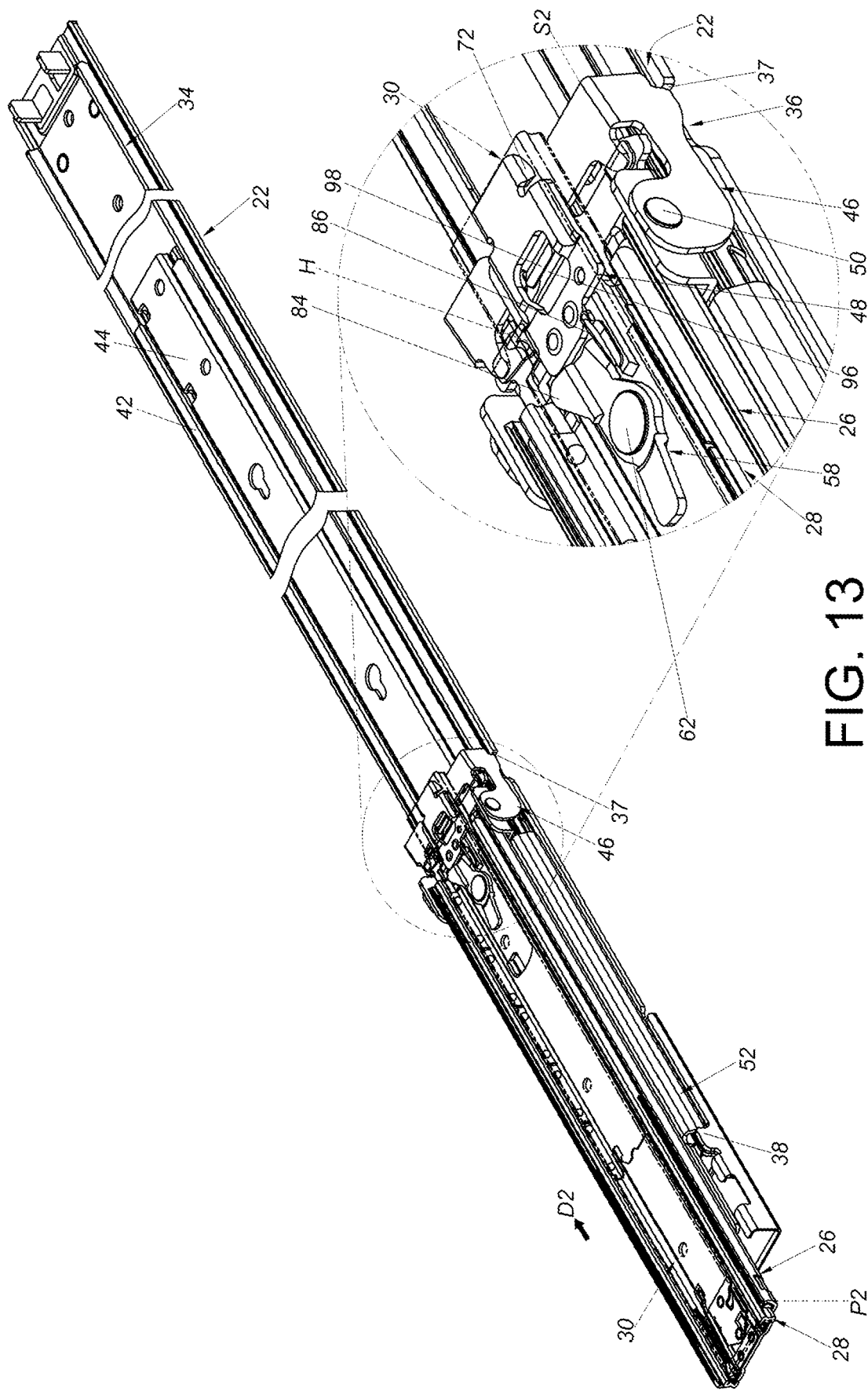
FIG. 13 is a diagram of the slide rail assembly as the second rail displaces with respect to the first rail away from the third predetermined position along the second predetermined direction according to the embodiment of the present invention.

As shown in FIG. 13 and FIG. 14, one of the second rail 28 and the first auxiliary member 46 includes a first guiding feature 96. Preferably, the other one of the second rail 28 and the first auxiliary member 46 includes a second guiding feature 98 for cooperating with the first guiding feature 96. In this embodiment, by way of example, the first guiding feature 96 and the second guiding feature 98 can be an inclined surface or an arc surface. However, the present invention is not limited to this embodiment.

During a displacement of the second rail 28 away from the third predetermined position P3 along the second predetermined direction D2, the second rail 28 is configured to terminate a blocking between the blocking feature 37 and the first rail 26. In this embodiment, by way of example, the second rail 28 can include the first guiding feature 96, and the first auxiliary member 46 can include the second guiding feature 98. The first guiding structure 96 of the second rail 28 can abut against the second guiding structure 98 of the first auxiliary member 46 for driving the first auxiliary member 46 from the second state S2 as shown in FIG. 13 to the first state S1 as shown in FIG. 14, such that the blocking feature 37 on the supporting frame 22 does not block the first auxiliary member 46 on the first rail for allowing the first rail 26 to displace away from the second predetermined position P2 along the second predetermined direction D2. Accordingly, the third rail 30, the second rail 28 and the first rail 26 can be displaced along the second predetermined direction D2 until the slide rail assembly 24 is moved back to the retracted state as shown in FIG. 3.

It should be noticed that the slide rail assembly 24 can be usually adapted for a cabinet or a rack, and the third rail 30 can be configured to support a carried object, such as an electronic apparatus or a drawer. The slide rail assembly 24 can ensure the second rail 28 and the first rail 26 to displace synchronously and prevent the third rail 30 and the second rail 28 from being pulled out along the first predetermined direction D1 without a displacement of the first rail 26. Therefore, the slide rail assembly 24 can solve a technical problem that it takes a lot of effort to overcome an excessive friction between a first rail and a supporting frame and/or between the first rail and a supporting rail caused by, e. g., a weight of a carried object, to pull out the first rail if a third rail and a second rail have been pulled out without a displacement of the first rail.

From the above, the slide rail assembly 24 includes the characteristics of allowing synchronous displacements of the second rail 28 and the first rail 26 along the first predetermined direction D1 with respect to the supporting frame 22 and/or allowing synchronous displacements of the third rail 30 and the second rail 28 along the first predetermined direction D1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism comprising:
   a supporting frame comprising a disengaging feature; and
   a slide rail assembly movable with respect to the supporting frame, the slide rail assembly comprising a first rail, a second rail and a third rail, the first rail being an outer rail, the second rail being a middle rail, and the third rail being an inner rail;
   wherein the second rail and the first rail displace synchronously during a displacement of the second rail with respect to the supporting frame away from a first predetermined position along a first predetermined direction;
   wherein the disengaging feature of the supporting frame is configured to terminate a displacement synchronization between the second rail and the first rail when the second rail and the first rail are synchronously displaced to a second predetermined position along the first predetermined direction;
   wherein the slide rail assembly further comprises a first auxiliary member and a second auxiliary member, the first auxiliary member is arranged on the first rail, the second auxiliary member is arranged on the second rail, and the second rail and the first rail displace synchronously by an abutment of the first auxiliary member and the second auxiliary member during the displacement of the second rail with respect to the supporting frame away from the first predetermined position along the first predetermined direction;
   wherein one of the first auxiliary member and the second auxiliary member is movable, and the one of the first auxiliary member and the second auxiliary member is configured to move to a first state for abutting against another one of the first auxiliary member and the second auxiliary member in response to a resilient deformation of a resilient member;
   wherein the disengaging feature of the supporting frame is configured to allow the resilient member to be released to drive the one of the first auxiliary member and the second auxiliary member from the first state to a second state to disengage from the another one of the first auxiliary member and the second auxiliary member for terminating the displacement synchronization between the second rail and the first rail when the second rail is displaced to the second predetermined position.

2. The slide rail mechanism of claim 1, wherein the second rail is movably mounted between the first rail and the third rail.

3. The slide rail mechanism of claim 1, wherein the disengaging feature of the supporting frame is formed by excavating and for providing a moving space for the one of the first auxiliary member and the second auxiliary member, and the supporting frame further comprises a blocking feature located adjacent to the disengaging feature and configured to block the first rail for preventing the first rail from displacing away from the second predetermined position along a second predetermined direction opposite to the first predetermined direction.

4. The slide rail mechanism of claim 3, wherein the slide rail assembly further comprises a working member movably mounted on the second rail, a corresponding feature is arranged on the third rail, and the third rail drives the second rail to synchronously displace together with the third rail by an abutment of the corresponding feature and the working member during a displacement of the third rail along the first predetermined direction.

5. The slide rail mechanism of claim 4, wherein the working member is pivotally connected to the second rail by a connecting member, and the working member is driven to a predetermined state by a resilient object for abutting against the corresponding feature.

6. The slide rail mechanism of claim 5, wherein a disengaging structure is arranged on the first rail, the disengaging structure is configured to terminate a displacement synchronization between the third rail and the second rail when the third rail and the second rail are synchronously displaced to a disengaging position along the first predetermined direction.

7. The slide rail mechanism of claim 6, wherein a blocking structure is further arranged on the first rail and located adjacent to the disengaging structure, the blocking structure blocks the second rail for preventing the second rail from displacing away from a third predetermined position along the second predetermined direction when the second rail is displaced to the third predetermined position along the first predetermined direction.

8. A slide rail mechanism comprising:
   a supporting frame comprising a disengaging feature; and
   a slide rail assembly movable with respect to the supporting frame, the slide rail assembly comprising a first rail, a second rail and a third rail, a disengaging structure being arranged on the first rail, and the slide rail assembly further comprising a working member movably mounted on the second rail;
   wherein the second rail and the first rail displace synchronously during a displacement of the second rail with respect to the supporting frame away from a first predetermined position along a first predetermined direction;
   wherein the disengaging feature of the supporting frame is configured to terminate a displacement synchronization between the second rail and the first rail when the second rail and the first rail are synchronously displaced to a second predetermined position along the first predetermined direction;
   wherein the third rail and the second rail displace synchronously during a displacement of the third rail along the first predetermined direction, and the disengaging structure is configured to terminate a displacement synchronization between the third rail and the second rail when the third rail and the second rail are synchronously displaced to a disengaging position along the first predetermined direction;

wherein a corresponding feature is arranged on the third rail, and the third rail drives the second rail to synchronously displace together with the third rail by an abutment of the corresponding feature and the working member during the displacement of the third rail along the first predetermined direction.

9. The slide rail mechanism of claim 8, wherein a blocking structure is further arranged on the first rail and located adjacent to the disengaging structure, the blocking structure blocks the second rail for preventing the second rail from displacing away from a third predetermined position along a second predetermined direction opposite to the first predetermined direction and the third rail is displaceable to a fourth predetermined position along the first predetermined direction when the second rail is displaced to the third predetermined position along the first predetermined direction, and the third rail is configured to terminate a blocking between the blocking structure and the second rail during a displacement of the third rail away from the fourth predetermined position along the second predetermined direction.

10. The slide rail mechanism of claim 9, wherein the supporting frame further comprises a blocking feature located adjacent to the disengaging feature and configured to block the first rail for preventing the first rail from displacing away from the second predetermined position along the second predetermined direction, and the second rail is configured to terminate a blocking between the blocking feature and the first rail during a displacement of the second rail away from the third predetermined position along the second predetermined direction.

11. The slide rail mechanism of claim 8, wherein the first rail is an outer rail, the second rail is a middle rail, and the third rail is an inner rail.

12. The slide rail mechanism of claim 8, wherein the slide rail assembly further comprises a first auxiliary member and a second auxiliary member, the first auxiliary member is arranged on the first rail, the second auxiliary member is arranged on the second rail, and the second rail and the first rail displace synchronously by an abutment of the first auxiliary member and the second auxiliary member during the displacement of the second rail with respect to the supporting frame away from the first predetermined position along the first predetermined direction.

13. The slide rail mechanism of claim 12, wherein one of the first auxiliary member and the second auxiliary member is movable, and the one of the first auxiliary member and the second auxiliary member is configured to move to a first state for abutting against another one of the first auxiliary member and the second auxiliary member in response to a resilient deformation of a resilient member.

14. The slide rail mechanism of claim 13, wherein the disengaging feature of the supporting frame is configured to allow the resilient member to be released to drive the one of the first auxiliary member and the second auxiliary member from the first state to a second state to disengage from the another one of the first auxiliary member and the second auxiliary member for terminating the displacement synchronization between the second rail and the first rail when the second rail is displaced to the second predetermined position.

15. The slide rail mechanism of claim 14, wherein the disengaging feature of the supporting frame is formed by excavating and for providing a moving space for the one of the first auxiliary member and the second auxiliary member.

16. The slide rail mechanism of claim 8, wherein the working member is pivotally connected to the second rail by a connecting member, and the working member is driven to a predetermined state by a resilient object for abutting against the corresponding feature.

* * * * *